United States Patent
Galler et al.

(10) Patent No.: US 10,074,794 B2
(45) Date of Patent: Sep. 11, 2018

(54) MULTILAYER COMPONENT COMPRISING AN EXTERNAL CONTACT AND METHOD FOR PRODUCING A MULTILAYER COMPONENT COMPRISING AN EXTERNAL CONTACT

(71) Applicant: EPCOS AG, Munich (DE)

(72) Inventors: Martin Galler, Kalsdorf (AT); Marion Ottlinger, Deutschlandsberg (AT)

(73) Assignee: EPCOS AG, Munich (DE)

( * ) Notice: Subject to any disclaimer, the term of this patent is extended or adjusted under 35 U.S.C. 154(b) by 248 days.

(21) Appl. No.: 14/907,800

(22) PCT Filed: Jul. 22, 2014

(86) PCT No.: PCT/EP2014/065746
§ 371 (c)(1),
(2) Date: Jan. 26, 2016

(87) PCT Pub. No.: WO2015/022154
PCT Pub. Date: Feb. 19, 2015

(65) Prior Publication Data
US 2016/0190424 A1    Jun. 30, 2016

(30) Foreign Application Priority Data
Aug. 13, 2013 (DE) .................. 10 2013 108 753

(51) Int. Cl.
*H01L 41/083* (2006.01)
*H01L 41/047* (2006.01)
(Continued)

(52) U.S. Cl.
CPC ........ *H01L 41/0472* (2013.01); *B23K 1/0016* (2013.01); *H01C 1/14* (2013.01);
(Continued)

(58) Field of Classification Search
CPC . H01L 41/0472; H01L 41/293; B23K 1/0016; H01C 1/14; H01C 7/10; H01C 17/28; H01G 4/008; H01G 4/232; H01G 4/2325; H01G 4/30; H01G 13/006; H01K 41/0472
(Continued)

(56) References Cited

U.S. PATENT DOCUMENTS 4,559,279 A * 12/1985 Honjo .................. H01G 4/0085
428/632
6,411,018 B1 * 6/2002 Heinz ................. H01L 41/0475
310/363
(Continued)

FOREIGN PATENT DOCUMENTS

CN    1973384 A    5/2007
CN    101431038 A    5/2009
(Continued)

*Primary Examiner* — Thomas Dougherty
(74) *Attorney, Agent, or Firm* — Slater Matsil, LLP

(57) ABSTRACT

A multilayer component includes a main body and an external contact. The external contact has a connection element and a contact layer. The contact layer electrically conductively connects the main body to the connection element. A connection between the main body and the connection element is produced by sintering of the contact layer.

16 Claims, 1 Drawing Sheet

(51) Int. Cl.
*H01G 4/30* (2006.01)
*H01C 1/14* (2006.01)
*H01L 41/293* (2013.01)
*H01G 4/232* (2006.01)
*B23K 1/00* (2006.01)
*H01C 7/10* (2006.01)
*H01C 17/28* (2006.01)
*H01G 4/008* (2006.01)
*H01G 13/00* (2013.01)
*H01G 4/228* (2006.01)

(52) U.S. Cl.
CPC ............... *H01C 7/10* (2013.01); *H01C 17/28* (2013.01); *H01G 4/008* (2013.01); *H01G 4/232* (2013.01); *H01G 4/2325* (2013.01); *H01G 4/30* (2013.01); *H01G 13/006* (2013.01); *H01L 41/293* (2013.01); *H01G 4/228* (2013.01)

(58) Field of Classification Search
USPC .......................................................... 310/366
See application file for complete search history.

(56) References Cited

U.S. PATENT DOCUMENTS

| | | | |
|---|---|---|---|
| 7,868,524 B2 | 1/2011 | Florian et al. | |
| 8,004,155 B2 | 8/2011 | Nakamura | |
| 9,059,392 B2 | 6/2015 | Rinner et al. | |
| 2002/0043901 A1* | 4/2002 | Kihara | H01L 41/0472 310/366 |
| 2005/0280336 A1* | 12/2005 | Mochizuki | H01L 41/0472 310/366 |
| 2006/0232172 A1* | 10/2006 | Asano | H01L 41/0472 310/366 |
| 2007/0176521 A1 | 8/2007 | Nakamura | |
| 2007/0278907 A1 | 12/2007 | Kondo et al. | |
| 2010/0156251 A1 | 6/2010 | Hohmann et al. | |
| 2012/0055707 A1 | 3/2012 | Schäfer et al. | |
| 2012/0132729 A1* | 5/2012 | Nakamura | F02M 51/0603 239/533.3 |
| 2013/0140960 A1* | 6/2013 | Gerletz | H01L 41/0472 310/366 |
| 2015/0300894 A1* | 10/2015 | Robutel | G01N 29/036 310/323.21 |
| 2017/0372820 A1* | 12/2017 | Wozniak | H01C 7/112 |

FOREIGN PATENT DOCUMENTS

| | | |
|---|---|---|
| DE | 102004002484 A1 | 8/2005 |
| DE | 102005017108 A1 | 7/2006 |
| DE | 102005027364 A1 | 12/2006 |
| DE | 102006018034 A1 | 10/2007 |
| DE | 102007049145 A1 | 4/2009 |
| DE | 102008056746 A1 | 5/2010 |
| DE | 102008055144 A1 | 7/2010 |
| DE | 102010044326 A1 | 3/2012 |
| EP | 1675190 A1 | 6/2006 |
| EP | 1732146 A1 | 12/2006 |
| EP | 1780813 A1 | 5/2007 |
| JP | 2006013437 A | 1/2006 |
| JP | 2006157259 A | 6/2006 |
| JP | 2009534825 A | 9/2009 |
| JP | 2010065277 A | 3/2010 |
| JP | 2010123647 A | 6/2010 |
| JP | 2005101207 A | 4/2015 |
| WO | 2005029602 A1 | 3/2005 |
| WO | 2005086247 A1 | 9/2005 |
| WO | 2007118883 A1 | 10/2007 |
| WO | 2010055071 A1 | 5/2010 |

* cited by examiner

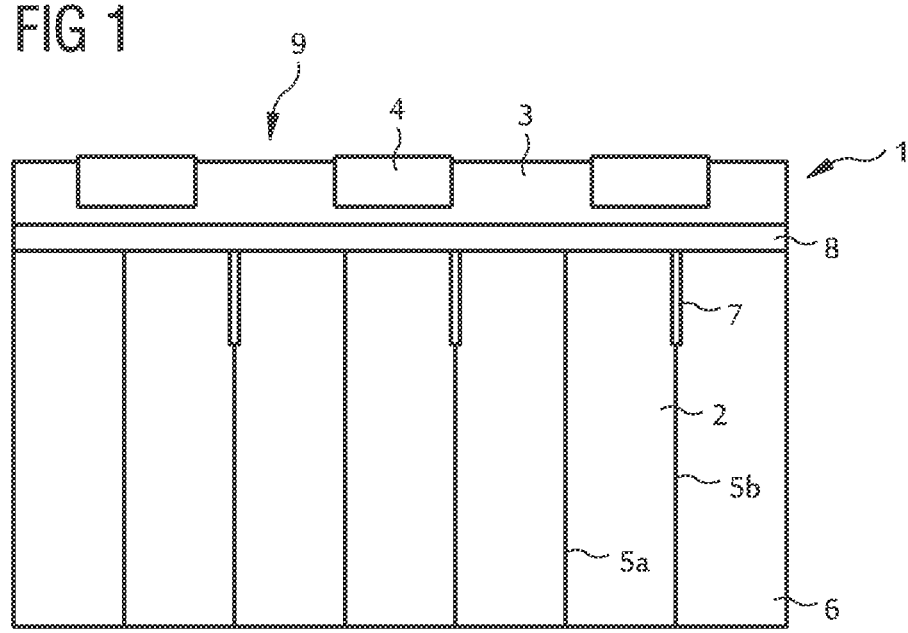
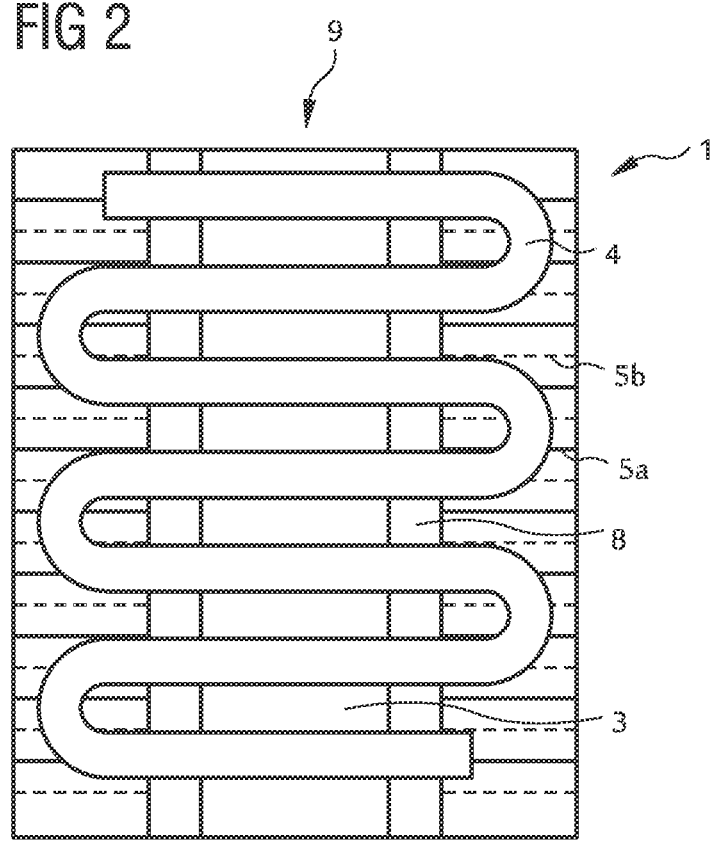

MULTILAYER COMPONENT COMPRISING AN EXTERNAL CONTACT AND METHOD FOR PRODUCING A MULTILAYER COMPONENT COMPRISING AN EXTERNAL CONTACT

This patent application is a national phase filing under section 371 of PCT/EP2014/065746, filed Jul. 22, 2014, which claims the priority of German patent application 10 2013 108 753.1, filed Aug. 13, 2013, each of which is incorporated herein by reference in its entirety.

TECHNICAL FIELD

Embodiments of the invention relate to a multilayer component comprising an external contact and method for producing a multilayer component comprising an external contact.

BACKGROUND

For contacting a multilayer component, by way of example, a connection element is soldered, adhesively bonded or welded to a main body. In the case of such fixing however, the contacting can influence the movements of the actuator. Moreover, the contacting can be damaged by the frequent deflection of the actuator.

SUMMARY

A multilayer component comprising an external contact is specified. By way of example, the multilayer component is a piezoactuator that can be used for actuating an injection valve in a motor vehicle. Alternatively, the multilayer component can be for example a multilayer capacitor or a multilayer varistor.

Embodiments specify an improved multilayer component. Particular embodiments specify a particularly reliable multilayer component.

BRIEF DESCRIPTION OF THE DRAWINGS

The invention is explained below with reference to schematic figures, which are not true to scale.

In the figures:

FIG. 1 shows a sectional illustration of a multilayer component; and

FIG. 2 shows a side view of the multilayer component from FIG. 1.

DETAILED DESCRIPTION OF ILLUSTRATIVE EMBODIMENTS

A multilayer component is specified, comprising a main body and an external contact. The external contact has a connection element and a contact layer. The contact layer electrically conductively connects the main body to the connection element. A connection between the main body and the connection element is produced by sintering of the contact layer. The temperature during sintering is preferably less than 400° C. By way of example, the contact layer is sintered at 250° C.

The sintered contact layer has a polycrystalline microstructure. In particular, grains and grain boundaries are formed in the sintered contact layer. Preferably, pores and/or sintering necks are formed in the sintered contact layer. The pores and/or sintering necks are formed, for example, between metal particles, or between grains.

A sintered contact layer has the advantage that it has a high electrical conductivity. Moreover, a sintered contact layer has a high thermal conductivity. In particular, a sintered contact layer has a higher electrical conductivity and a higher thermal conductivity than solders, for example, in particular soft solders. Furthermore, the sintered contact layer exhibits low material fatigue at high temperatures. In particular, only a slight plastic reshaping of the contact layer and a slight crack growth in the contact layer take place. This is owed to a high melting point of the contact layer in comparison with solders. Even in the event of mechanical or thermomechanical cyclic load, only low material fatigue of the contact layer occurs.

On account of the relatively high melting point of the contact layer, multilayer components having such a contact layer can be soldered on circuit boards in a reflow process.

The sintering of the contact layer can take place without the use of fluxes. Therefore, there is also no need for a washing process for removing flux residues, as required, for example, in the case of soldering.

The process temperature during the sintering of the contact layer is significantly lower than during hard soldering or during firing of metal pastes. As a result, the thermal stress in the process is relatively low and the process is simpler and more cost-effective.

In accordance with one embodiment, the contact layer is porous. Preferably, the contact layer has a porosity of between 1 percent by volume and 50 percent by volume.

On account of the porosity of the contact layer, the modulus of elasticity of the contact layer is lower than in the case of impermeable metal layers. As a result, it is possible to reduce clamping effects and mechanical stresses in the ceramic body.

The contact layer comprises a metal. The contact layer preferably consists of silver or copper. In particular, the contact layer consists of pure silver or copper to the extent of at least 95 percent by weight, preferably to the extent of 99 percent by weight. In particular, the contact layer can consist of pure silver or copper to the extent of at least 99% by weight.

The melting point of the metal of the contact layer is above the sintering temperature of the contact layer. In accordance with one embodiment, the melting point of the contact layer is above 400° C. In particular, the contact layer has a high thermal stability at operating temperatures above 200° C.

In accordance with one embodiment, the contact layer has a thickness of between 2 μm and 200 μm. Preferably, the contact layer has a thickness of between 10 μm and 100 μm.

The main body of the multilayer component can comprise a stack of dielectric layers and internal electrode layers. The external contact can serve for electrically contacting the internal electrode layers. The main body is embodied in a parallelepipedal fashion, for example.

Preferably, the dielectric layers and the internal electrode layers are stacked along a stacking direction. The stacking direction preferably corresponds to the longitudinal direction of the main body. Preferably, the dielectric layers and the internal electrode layers are stacked alternately one above another.

Preferably, the internal electrode layers contain copper or consist of copper. Alternatively, the internal electrode layers contain silver-palladium or consist of silver-palladium.

The dielectric layers can comprise a piezoelectric material. By way of example, the dielectric layers can comprise a ceramic material, in particular a piezoceramic material. Green sheets can be used for producing the main body, wherein a metal paste, for example, is applied to the green sheets for the purpose of forming internal electrode layers. By way of example, the metal paste is applied in a screen printing method. The metal paste can contain copper. Alternatively, the metal paste can contain silver or silver-palladium. After the metal paste has been applied, the sheets are preferably stacked, pressed and jointly sintered, thus giving rise to a monolithic sintering body. Preferably, the main body of the component is formed by a monolithic sintering body, for example, by a sintering body produced in the manner described above.

By way of example, the multilayer component is embodied as a piezoelectric component, for example, as a piezoactuator. In the case of a piezoactuator, piezoelectric layers arranged between the internal electrode layers expand when a voltage is applied to the internal electrode layers, such that a stroke of the piezoactuator is generated. The multilayer component can also be embodied as some other component, for example, as a multilayer capacitor. The multilayer capacitor is preferably suitable for power electronic applications with DC voltages of greater than 250 volts and use temperatures above 120° C.

The external contact preferably serves for applying a voltage between internal electrode layers that are adjacent in the stacking direction. In particular, the external contact serves for feeding current to the internal electrode layers. By way of example, two external electrodes are arranged on opposite outer sides of the main body. An external electrode in each case comprises a contact layer and a connection element.

Preferably, the internal electrode layers are electrically connected to one of the external electrodes and electrically insulated from the other external electrode alternately in the stacking direction. In this case, the external contact can be designed with regard to the loadings at the main body.

By way of example, the electrode paste is applied such that the electrode layers, alternately as viewed in the stacking direction, extend as far as one outer side of the stack and are spaced apart from the opposite outer side of the stack. In this way, the electrode layers can be electrically connected alternately to one of the external contacts. In accordance with one embodiment, an air gap can be present between one end of the internal electrode layer and an outer side of the main body. By way of example, alternately every second internal electrode layer can be set back by means of etching, such that a trench is arranged between the etched internal electrode layers and an outer side of the main body. In order to improve the breakdown voltage, the air gaps or the trenches can be filled with insulating material. The insulating material can be an elastomeric material, for example.

In the case of a multilayer component comprising a contact layer fixed by sintering, the trenches can be almost completely filled with insulating material. This results from the fact that the use of a flux can be dispensed with. As a result, no flux residues which make it more difficult for the trenches to be filled or prevent the trenches from being filled can remain in the trenches. In this way, the breakdown voltage of the multilayer component can be increased by approximately 10% in comparison with a multilayer component comprising a soldered external contact.

Alternatively, the multilayer component can be a fully active multilayer component. In the case of a fully active multilayer component, the internal electrode layers extend over the entire cross section of the main body. For alternately connecting the internal electrode layers to an external contact, the internal electrode layers are alternately covered with electrically insulating material on an outer side.

Preferably, the internal electrode layers are electrically connected to one of the external electrodes and electrically insulated from the other external electrode alternately in the stacking direction.

The external contact is embodied in a strip-shaped fashion, for example. Preferably, the external contact runs along the stacking direction of the main body. By way of example, the external contact only partly covers an outer side of the main body. Alternatively, the external contact can completely cover an outer side of the main body.

The connection elements can have the shape of a planar body or the shape of a three-dimensionally structured body. A planar body can have, for example, the shape of a metal sheet, a meander, a comb or a conductor. A three-dimensionally structured body can have, for example, the shape of a wire braiding, a knitted wire mesh or a corrugated metal sheet.

The connection elements preferably extend over the entire length of the multilayer component. As a result, a reliable contacting even in the case of an interruption of the contact layer during operation an overall linking of the component can always be guaranteed.

In accordance with one embodiment, a base metallization is additionally applied between the main body and the contact layer. The base metallization can be formed by firing a metal paste. In particular, the base metallization can be linked to the contact layer by sintering. The base metallization can be admixed with a glass paste. Alternatively, the base metallization can be applied to the main body by the sputtering of metal layers and can be linked to the contact layer by sintering. Accordingly, the base metallization can consist only of a layer applied by sputtering. Alternatively, the base metallization can be formed a by firing of a metal paste and by an additional sputtering layer between the fired metal paste and the contact layer.

Furthermore, a method for producing a multilayer component is specified. The method comprises, in a first step, providing a main body and a connection element. Afterwards, a metal paste is applied to at least one outer side of the main body. The connection element is positioned on the metal paste. In particular, the connection element can be at least partly pressed into the metal paste. Afterwards, the metal paste is sintered. The sintering is carried out at a temperature below 400° C. As a result, the connection element is electrically conductively connected to the main body.

The metal paste can contain metal particles, salts and organic material as solvent and coating material of the solids. The metal particles are silver or copper particles, for example. Silver carbonate, for example, is suitable as salt.

The metal paste is applied using a stencil, for example. The applied layer of the metal paste is preferably 1 mm wide and 100 μm thick.

The contact layer is dried and sintered. By way of example, the metal paste is subjected to binder removal for 75 minutes at 160° C. and is then sintered for 105 minutes at 250° C. The sintering can be carried out under pressure or without pressure.

After the sintering process, the contact layer is present as a solid, porous, pure metal layer. The main body and the external contact are fixedly linked to the contact layer.

During the sintering process, the metal paste is converted to the porous contact layer.

FIG. 1 shows a multilayer component 1 in a sectional illustration.

The multilayer component 1 comprises a main body 2. The main body 2 comprises alternately arranged first and second internal electrode layers 5a, 5b and piezoelectric layers 6.

An external contact 9 is applied on an outer side of the main body 2. The external contact 9 comprises a contact layer 3 and a connection element 4. The contact layer 3 is porous. Moreover, the external contact 9 comprises a base metallization 8. The base metallization 8 can comprise, for example, a fired metal layer and/or a sputtering layer. The fired metal layer can comprise a glass additive.

Every first internal electrode layer 5a extends as far as the outer side of the main body 2 and is contacted there by the external contact 9. Every second internal electrode layer 5b is spaced apart from the outer side of the main body 2. In particular, an insulation zone 7 is arranged between every second internal electrode layer 5b and the outer side of the main body. The insulation zone 7 can be embodied as an air gap. Alternatively, the insulation zone 7 can be filled with an insulating material.

As is evident in FIG. 1, the connection element 4 is at least partly embedded into the contact layer 3. A reliable connection between the connection element 4 and the contact layer 3 is produced as a result.

FIG. 2 shows the multilayer component 1 in a side view. In this case, every second internal electrode layer 5b which is spaced apart from the outer side of the main body 2 by an insulation zone 7 is illustrated by dashed lines. On an opposite outer side of the main body, the second internal electrode layers 5b extend as far as the outer side of the main body 2, while the first internal electrode layers 5a are spaced apart therefrom by an insulation zone 7.

The base metallization 8 and the contact layer 3 are embodied in the form of a strip, wherein the base metallization 8 is somewhat wider than the contact layer 3.

The connection element 4 shown in FIG. 2 is embodied in a meandering fashion. However, the connection element 4 can also have other shapes, for example, that of a conductor, a metal sheet or corrugated metal sheet, a wire screen or a comb.

The invention claimed is:

1. A multilayer component comprising:
   a main body; and
   an external contact that has a connection element and a contact layer,
   wherein the contact layer electrically conductively connects the main body to the connection element,
   wherein the contact layer between the main body and the connection element exhibits physical characteristics from sintering of the contact layer, and
   wherein the contact layer comprises a metal paste including silver carbonate.

2. The multilayer component according to claim 1, wherein the contact layer is porous.

3. The multilayer component according to claim 2, wherein the contact layer has a porosity between 1% by volume and 50% by volume.

4. The multilayer component according to claim 1, wherein the contact layer contains a metal.

5. The multilayer component according to claim 4, wherein the contact layer contains silver or copper.

6. The multilayer component according to claim 1, wherein the contact layer comprises a substance that is pure to the extent of at least 95% by weight.

7. The multilayer component according to claim 6, wherein the contact layer comprises silver that is pure to the extent of at least 95% by weight.

8. The multilayer component according to claim 7, wherein the contact layer consists of silver that is pure to the extent of at least 95% by weight.

9. The multilayer component according to claim 1, wherein the contact layer has a thickness between 2 µm and 200 µm.

10. The multilayer component according to claim 1, wherein the contact layer has a melting point of above 400° C.

11. The multilayer component according to claim 1, further comprising a base metallization between the main body and the contact layer.

12. The multilayer component according to claim 1, wherein the connection element has the form of a meander, a comb, a metal sheet, a wire braiding, a knitted wire mesh, or a corrugated metal sheet.

13. The multilayer component according to claim 1, wherein the multilayer component is embodied as a piezoactuator or as a multilayer capacitor.

14. A multilayer component comprising:
   a main body; and
   an external contact that has a connection element and a contact layer,
   wherein the contact layer electrically conductively connects the main body to the connection element,
   wherein the contact layer between the main body and the connection element is porous, and
   wherein the contact layer comprises a metal paste including silver carbonate.

15. The multilayer component according to claim 11, wherein the contact layer has a porosity between 1% by volume and 50% by volume.

16. The multilayer component according to claim 11, wherein the contact layer consists of silver that is pure to the extent of at least 95% by weight.

* * * * *

UNITED STATES PATENT AND TRADEMARK OFFICE
CERTIFICATE OF CORRECTION

PATENT NO. : 10,074,794 B2
APPLICATION NO. : 14/907800
DATED : September 11, 2018
INVENTOR(S) : Martin Galler et al.

Page 1 of 1

It is certified that error appears in the above-identified patent and that said Letters Patent is hereby corrected as shown below:

In the Claims

In Column 6, Line 45, Claim 15, delete "claim 11" and insert --claim 14--.

In Column 6, Line 48, Claim 16, delete "claim 11" and insert --claim 14--.

Signed and Sealed this
Thirtieth Day of October, 2018

Andrei Iancu
*Director of the United States Patent and Trademark Office*